(12) United States Patent
Neumann et al.

(10) Patent No.: US 9,703,205 B2
(45) Date of Patent: Jul. 11, 2017

(54) MEASURING AN OPTICAL SYMMETRY PROPERTY ON A PROJECTION EXPOSURE APPARATUS

(71) Applicant: Carl Zeiss SMT GmbH, Oberkochen (DE)

(72) Inventors: Jens Timo Neumann, Aalen (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/853,443

(22) Filed: Sep. 14, 2015

(65) Prior Publication Data

US 2016/0004168 A1    Jan. 7, 2016

Related U.S. Application Data

(63) Continuation of application No. PCT/EP2014/000588, filed on Mar. 7, 2014.
(Continued)

(30) Foreign Application Priority Data

Mar. 14, 2013 (DE) .................. 10 2013 204 466

(51) Int. Cl.
*G03B 27/54* (2006.01)
*G03B 27/72* (2006.01)
(Continued)

(52) U.S. Cl.
CPC ..... *G03F 7/70133* (2013.01); *G01M 11/0207* (2013.01); *G01M 11/0242* (2013.01);
(Continued)

(58) Field of Classification Search
CPC .................. G03F 7/70133; G03F 7/70591
(Continued)

(56) References Cited

U.S. PATENT DOCUMENTS 6,040,894 A * 3/2000 Takahashi ........... G03F 7/70091
                                                     355/53
6,360,012 B1    3/2002 Kreuzer
(Continued)

FOREIGN PATENT DOCUMENTS

JP    2001230179 A    8/2001
JP    2001230180 A    8/2001
(Continued)

OTHER PUBLICATIONS

Office Action in corresponding Korean Application No. 1020157027229, dated Jul. 22, 2016, along with an English translation.
(Continued)

*Primary Examiner* — Hung Henry Nguyen
(74) *Attorney, Agent, or Firm* — Edell, Shapiro & Finnan, LLC (57) ABSTRACT

A method for measuring an optical symmetry property on a microlithographic projection exposure apparatus (10) together with a microlithographic projection exposure apparatus and an associated microlithographic measurement mask are disclosed. The method includes arranging at least one measurement structure (60; 66) in an exposure beam path (32) of the projection exposure apparatus, wherein the measurement structure includes a pinhole stop (62) and a diffraction grating (64) arranged within an aperture (63) of the pinhole stop. Furthermore, the method includes measuring an intensity of a diffracted radiation generated at the
(Continued)

diffraction grating (64) after interaction of the radiation with at least one optical element (22) of the projection exposure apparatus.

20 Claims, 5 Drawing Sheets

Related U.S. Application Data (60) Provisional application No. 61/783,572, filed on Mar. 14, 2013.

(51) Int. Cl.
*G03F 7/20* (2006.01)
*G01M 11/02* (2006.01)

(52) U.S. Cl.
CPC ............ *G03F 7/706* (2013.01); *G03F 7/7085* (2013.01); *G03F 7/70591* (2013.01)

(58) Field of Classification Search
USPC .......... 355/52, 53, 67–71; 356/124, 399–401
See application file for complete search history.

(56) References Cited

U.S. PATENT DOCUMENTS

| | | | |
|---|---|---|---|
| 6,710,856 B2* | 3/2004 | Van Der Laan | .... G03F 7/70133 355/52 |
| 7,443,485 B2* | 10/2008 | Van De Kerkhof | ............................ G03F 7/70591 355/67 |
| 7,924,436 B2 | 4/2011 | Mengel et al. | |
| 2001/0019407 A1 | 9/2001 | Sato et al. | |
| 2004/0180278 A1 | 9/2004 | Sato et al. | |
| 2006/0103826 A1 | 5/2006 | Kok et al. | |
| 2009/0015815 A1 | 1/2009 | Ohsaki | |
| 2010/0208223 A1 | 8/2010 | Minoda | |
| 2011/0205514 A1 | 8/2011 | Kita | |

FOREIGN PATENT DOCUMENTS

| | | |
|---|---|---|
| JP | 2002110540 A | 4/2002 |
| JP | 2005148102 A | 6/2005 |
| JP | 2009021450 A | 1/2009 |
| JP | 2010192471 A | 9/2010 |

OTHER PUBLICATIONS

International Search Report in counterpart International Application No. PCT/EP2014/000588, mailed Jul. 29, 2014.
Written Opinion in counterpart International Application No. PCT/EP2014/000588, dated Sep. 15, 2015.
Office Action in corresponding German Application No. 10 2013 204 466.6, dated Nov. 21, 2013, along with an English translation.
Office Action in corresponding Japanese Application No. 2015-560585, dated Aug. 30, 2016, along with an English translation.

\* cited by examiner

MEASURING AN OPTICAL SYMMETRY PROPERTY ON A PROJECTION EXPOSURE APPARATUS

CROSS REFERENCE TO RELATED APPLICATIONS

This application is a Continuation of International Application No. PCT/EP2014/000588, filed Mar. 7, 2014, which claims priority under 35 U.S.C. §119(a) to German Patent Application No. 10 2013 204 466.6 filed on Mar. 14, 2013, and which claims benefit under 35 U.S.C. §119(e) to U.S. Provisional Application No. 61/783,572 also filed on Mar. 14, 2013. The entire disclosures of all three related applications are considered part of and are incorporated by reference into the disclosure of the present application in their respective entireties.

FIELD OF THE INVENTION

The invention relates to a method for measuring an optical symmetry property on a microlithographic projection exposure apparatus. Furthermore, the invention relates to a lithographic measurement mask for measuring an optical symmetry property of a projection exposure apparatus, and to a microlithographic projection exposure apparatus.

BACKGROUND

In order to reduce imaging aberrations in microlithography it is useful for optical symmetry properties of a projection exposure apparatus to be known accurately. In this regard it is observed, for instance, that when dipole illumination is used, overlay errors occur to an increased extent if the relation between the poles of the dipole, also designated as "pole balance", is not balanced. In order to quantify such a pole balance, the pupil in the projection lens of the exposure apparatus is measured using a measurement mask having a pinhole stop, the aperture of which has a diameter of typically 80 to 100 µm. The intensity distribution generated in this case is imaged in a defocused manner onto a sensor in the vicinity of the wafer plane. With this measurement technique known to the person skilled in the art from the prior art, however, the pole balance can be measured only for the overall optical system of the projection exposure apparatus.

However, sensitivities with which unbalanced pole distributions affect overlay errors are dependent on whether the pole imbalance originates in the illumination system or in the projection optical unit. It is desirable, therefore, to measure the contributions to the pole distribution separately for different optical subregions of the projection exposure apparatus, such as, fir instance, separately for the illumination system and the projection lens.

SUMMARY

An object addressed by the invention is that of providing a method, a measurement mask and a projection exposure apparatus with which the problematic points mentioned above are solved and, in particular, it is possible to measure an optical symmetry property on a projection exposure apparatus relative to a subregion of an overall optical system of the projection exposure apparatus.

The object noted above can be solved in accordance with one exemplary embodiment according to the invention by the method explained below for measuring an optical symmetry property on a microlithographic projection exposure apparatus. The method comprises arranging at least one measurement structure in an exposure beam path of the projection exposure apparatus. The measurement structure comprises a pinhole stop and a diffraction grating arranged within an aperture of the pinhole stop. Furthermore, the method comprises measuring an intensity of a diffracted radiation generated at the diffraction grating after interaction of the radiation with at least one optical element of the projection exposure apparatus.

The diffracted radiation is generated by diffraction of an exposure radiation guided in the exposure beam path of the projection exposure apparatus at the diffraction grating. For this purpose, the period of the diffraction grating is adapted to the operating wavelength of the projection exposure apparatus in such a way that diffracted radiation is generated at the diffraction grating. The aperture of the pinhole stop can also be designated as "pinhole". In accordance with one embodiment, the aperture is dimensioned such that the pinhole stop has no significant diffracting effect on the exposure radiation. In this regard, the aperture can have, for example, a diameter of less than 2000 times, in particular less than 1000 times, the operating wavelength of the projection exposure apparatus, i.e. the wavelength of the exposure radiation, and greater than 100 times, in particular greater than 200 times, the operating wavelength, in particular a diameter of approximately 400 to 500 times the operating wavelength. For example, the aperture can have a diameter of 80-100 µm at an operating wavelength of 193 nm.

In accordance with one embodiment, the method according to the invention furthermore comprises determining an optical symmetry property on the projection exposure apparatus, in particular an optical symmetry property of an optical module of the projection exposure apparatus, using the measured intensity.

The provision of a measurement structure comprising a pinhole stop and a diffraction grating arranged within the aperture of the pinhole stop makes it possible to generate an intensity distribution which can be taken as a basis for obtaining information about an optical symmetry property on the projection exposure apparatus relative to a subregion of an overall optical system of the projection exposure apparatus. In this regard it is possible to obtain, for instance, influences of the illumination system and of the projection exposure apparatus on a pole balance of an incident illumination dipole on the basis of the intensity distribution.

In accordance with one embodiment according to the invention, the pinhole stop is a part of a measurement mask. The measurement mask is arranged for the purpose of measurement in a mask plane of the projection exposure apparatus.

In accordance with a further embodiment according to the invention, at least two measurement structures are arranged in the exposure beam path. Each of the measurement structures comprises a pinhole stop and a diffraction grating arranged within an aperture of the respective pinhole stop. Furthermore, the diffraction gratings of the two measurement structures have differing grating periods. In other words, the diffraction grating arranged within the aperture of the pinhole stop of a first of the measurement structures and the diffraction grating arranged within the aperture of the pinhole stop of a second of the measurement structures have different grating periods. The two measurement structures can be arranged successively or else simultaneously in the exposure beam path.

In accordance with a further embodiment according to the invention, a further measurement structure is arranged in the exposure beam path, said further measurement structure comprising a pinhole stop having a free aperture. A free aperture should be understood to mean that no shading element, in particular no grating, is arranged within the aperture. The further measurement structure and the measurement structure comprising the diffraction grating or the measurement structures comprising diffraction gratings can be arranged successively or else simultaneously in the exposure beam path.

In accordance with a further embodiment according to the invention, an optical symmetry property of an optical module disposed upstream or downstream of the measurement structure in the exposure beam path is determined using the measured intensity. Examples of optical modules disposed upstream or downstream include an illumination system and a projection lens of the projection exposure apparatus.

In accordance with a further embodiment according to the invention, an optical module disposed upstream of the measurement structure and an optical module disposed downstream of the measurement structure are arranged in the exposure beam path. During the intensity measurement, a symmetry property of an intensity distribution in a plane downstream of the downstream optical module is determined and a respective influence of the upstream optical module and/or an influence of the downstream optical module on the symmetry property are/is determined.

In accordance with a further embodiment according to the invention, a symmetry property of an angular distribution of an exposure radiation incident on a mask plane of the projection exposure apparatus is determined using the measured intensity. The symmetry property determined relates to a symmetry with respect to an optical axis of the illumination system.

In accordance with a further embodiment according to the invention, a symmetry property of an angular dependence of a transmittance of a projection lens of the projection exposure apparatus is determined using the measured intensity. An angular dependence of the transmittance should be understood to mean, in particular, the dependence of the transmittance on the angle of incidence on the projection lens. The symmetry property of the projection lens relates to a symmetry with respect to an optical axis of the projection lens.

In accordance with a further embodiment according to the invention, an influence of at least one optical module of the projection exposure apparatus on an intensity ratio of two illumination poles of the projection exposure apparatus is determined using the measured intensity. The intensity ratio determined is also designated as "pole balance".

Furthermore, the invention provides a microlithographic measurement mask for measuring an optical symmetry property on a microlithographic projection exposure apparatus. The measurement mask comprises at least one measurement structure comprising a pinhole stop and a diffraction grating arranged within an aperture of the pinhole stop.

In embodiments according to the invention, the measurement mask is configured for carrying out the method for measuring a symmetry property in one of the embodiments or embodiment variants described above. In other words, the measurement mask can be provided with features which serve for carrying out the measuring method in one of the embodiments described.

In accordance with a further embodiment, the measurement mask comprises at least two measurement structures. Each of the measurement structures comprises a pinhole stop and a diffraction grating arranged within an aperture of the respective pinhole stop. Furthermore, the diffraction gratings of the two measurement structures have different grating periods. In accordance with a further embodiment, the measurement mask furthermore comprises a further measurement structure comprising a pinhole stop having a free aperture.

Furthermore, the invention provides a microlithographic projection exposure apparatus comprising an illumination system for illuminating a mask plane with an exposure radiation, and a projection lens arranged downstream of the mask plane. Furthermore, the projection exposure apparatus comprises a measurement device configured to detect an intensity distribution in a measurement plane arranged downstream of the projection lens, a pupil of the projection lens becoming visible in said measurement plane when a pinhole stop is arranged in the mask plane. Moreover, the projection exposure apparatus comprises an evaluation device configured to determine, from a plurality of intensity distributions recorded in the measurement plane, an influence of the illumination system and/or an influence of the projection lens on a symmetry property of an intensity distribution of the pupil that is measured in the measurement plane.

The illumination system mentioned can comprise all optical elements arranged upstream of the mask plane, or else only a portion of said elements. In the present context, "arranged downstream" relates to the exposure beam path of the projection exposure apparatus. A position at which the pupil of the projection lens becomes visible is, in particular, a plane that is conjugate with respect to the pupil plane of the projection lens. The measurement device can be integrated, for example, in a displaceable wafer stage of the projection exposure apparatus, which is displaceable in the direction of the optical axis away from the wafer plane to such an extent that the pupil, i.e. the intensity distribution in the pupil, becomes visible.

In embodiments according to the invention, the projection exposure apparatus is configured for carrying out the method for measuring a symmetry property in one of the embodiments or embodiment variants described above. In other words, the projection exposure apparatus can be provided with features that serve for carrying out the measuring method in one of the embodiments described.

In accordance with one embodiment according to the invention, the evaluation device is configured to determine the influence of the illumination system and/or the influence of the projection lens on the symmetry property from intensity distributions which are generated by at least two different measurement structures arranged in the mask plane. The measurement structures each comprise a pinhole stop and a diffraction grating arranged within an aperture of the respective pinhole stop, and the diffraction gratings of the two measurement structures have different grating periods.

In accordance with a further embodiment according to the invention, the evaluation device is configured to determine the influence of the illumination system and/or the influence of the projection lens on an intensity ratio of two illumination poles of the projection exposure apparatus, said intensity ratio being measured in the measurement plane.

The features specified with regard to the abovementioned embodiments, exemplary embodiments or embodiment variants, etc. of the method according to the invention can correspondingly be applied to the measurement mask according to the invention and/or the projection exposure apparatus according to the invention. Conversely, the features specified with regard to the abovementioned embodiments, exemplary embodiments or embodiment variants of the measurement mask according to the invention and/or of the projection exposure apparatus according to the invention can be correspondingly applied to the method according to the invention. These and other features of the embodiments according to the invention are explained in the claims and in the description of the figures. The individual features can be realized either separately or in combination as embodiments of the invention. Furthermore, they can describe advantageous embodiments which are independently protectable and protection of which is claimed, if appropriate, only during or after pendency of the application.

BRIEF DESCRIPTION OF THE DRAWINGS

The above and further advantageous features of the invention are elucidated in the following detailed description of exemplary embodiments according to the invention with reference to the accompanying schematic drawings, in which.

DETAILED DESCRIPTION

In the exemplary embodiments or embodiments or embodiment variants described below, elements which are functionally or structurally similar to one another are as far as possible provided with the same or similar reference signs. Therefore, for the purpose of understanding the features of the individual elements of a specific exemplary embodiment, reference should be made to the description of other exemplary embodiments or the general description of the invention.

Figure 1:
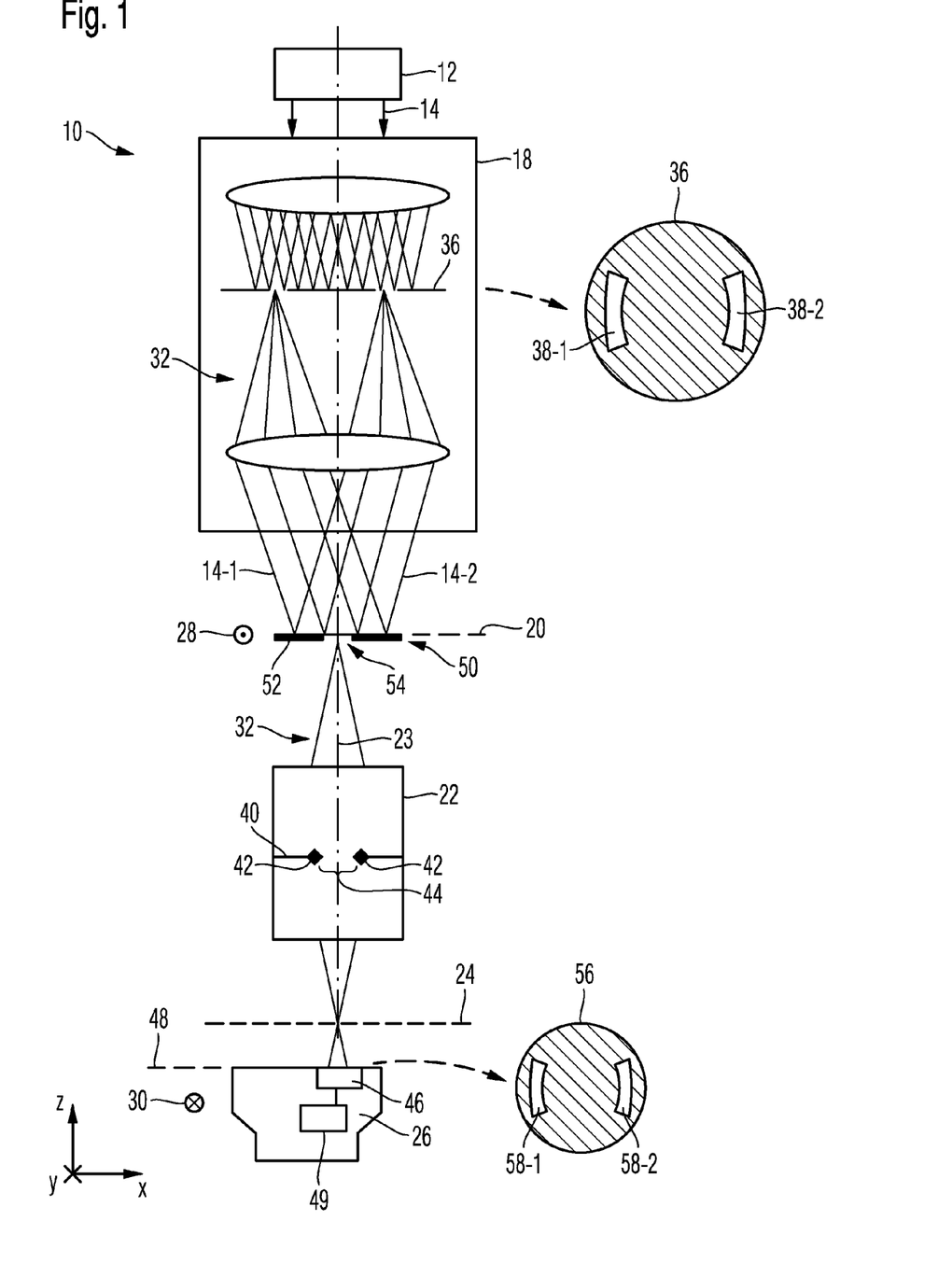
FIG. 1 shows a sectional view of a projection exposure apparatus in a measurement mode for measuring a dipole illumination in a pupillogram generated using a pinhole stop.

In order to facilitate the description, a cartesian xyz-coordinate system is indicated in the drawing and reveals the respective positional relationship of the components illustrated in the figures. In FIG. 1, the y-direction runs perpendicularly to the plane of the drawing into the latter, the x-direction runs toward the right and the z-direction runs upward.

FIG. 1 shows one exemplary embodiment of a microlithographic projection exposure apparatus 10 in one embodiment according to the invention. The projection exposure apparatus 10 comprises an exposure radiation source 12, such as e.g. a laser or a plasma source, for generating an exposure radiation 14. The wavelength of the exposure radiation 14 can be in the UV wavelength range, e.g. at 248 nm or 193 nm. Furthermore, the invention encompasses projection exposure apparatuses which are operated in the extreme ultraviolet wavelength range (EUV), e.g. at approximately 13.5 nm or at approximately 6.8 nm.

The exposure radiation 14 emitted by the exposure radiation source 12 enters into an illumination system 18, wherein the exposure radiation 14 passes through a beam conditioning optical unit and is thereupon radiated by an illuminator onto a mask plane 20, also designated as reticle plane. In production operation, a product mask (not illustrated in the drawing) is situated in the mask plane 20, said product mask being held by a mask stage (likewise not illustrated in the drawing). The mask stage is mounted such that it is displaceable relative to a frame of the projection exposure apparatus 10.

Below the mask plane 20, a projection lens 22 is arranged on the frame. The projection lens 22 serves to image mask structures from the mask plane 20 onto a substrate to be structured in the form of a wafer situated in a wafer plane 24. The projection lens 22 comprises a plurality of optical elements (not illustrated in the drawing), which can be embodied as lens elements and/or as mirrors depending on the design and exposure wavelength. The projection lens 22 furthermore comprises at least one pupil plane 40 in which a pupil 44 bordered by a pupil boundary 42 is situated. The pupil plane 40 is characterized in that the local intensity distribution of the exposure radiation, which converges to a specific field point in the wafer plane 24 during exposure operation, in the pupil plane 40 corresponds to the angularly resolved intensity distribution at said field point. This correspondence is ensured if the projection lens 22, as in the present case, is sinusoidally corrected.

The illumination system 18 and the projection lens 22 have a common optical axis 23. A plurality of different illumination settings can be set utilizing the illumination system 18. An illumination setting is understood to mean a specific defined angular distribution of the exposure radiation 14 radiated into the mask plane 20. Examples of such angular distributions include e.g. annular illumination, quadrupole illumination and dipole illumination. In the present case, the illumination system is set to the effect of radiating a dipole illumination oriented in the x-direction into the mask plane 20. The illumination system 18 thus generates a left illumination pole 14-1, which is incident on the mask plane 20 obliquely from the left, and a right illumination pole 14-2, which is incident on the mask plane 20 obliquely from the right.

In order to generate such a dipole angular distribution, the illumination system 18 in accordance with one embodiment can comprise a REMA lens. An aperture stop 36 is typically arranged in a pupil plane of the REMA lens. In the example illustrated, the aperture stop 36, for generating the x-dipole illumination, has two stop cutouts 38-1 and 38-2 offset in the x-direction. The projection exposure apparatus 10 comprises a stop archive, from which the appropriate aperture stop 36 can be taken and arranged in the pupil plane of the REMA lens, depending on the illumination requirement. Depending on the design of the illumination system 18, in addition or as an alternative to the aperture stop 36, other beam shaping optical elements can serve for forming the desired illumination angle distribution in the mask plane 20.

For production operation or exposure operation of the projection exposure apparatus 10, a wafer to be exposed is arranged onto a displaceable wafer stage 26 in the wafer plane 24. During the exposure of the wafer, the product mask and the wafer are then displaced in a synchronized movement with respect to one another. In this case, the wafer is displaced along a scanning direction 30 running parallel to the y-direction of the coordinate system. The mask is displaced synchronously along a scanning direction 28 opposite to the scanning direction 30.

Figure 2:
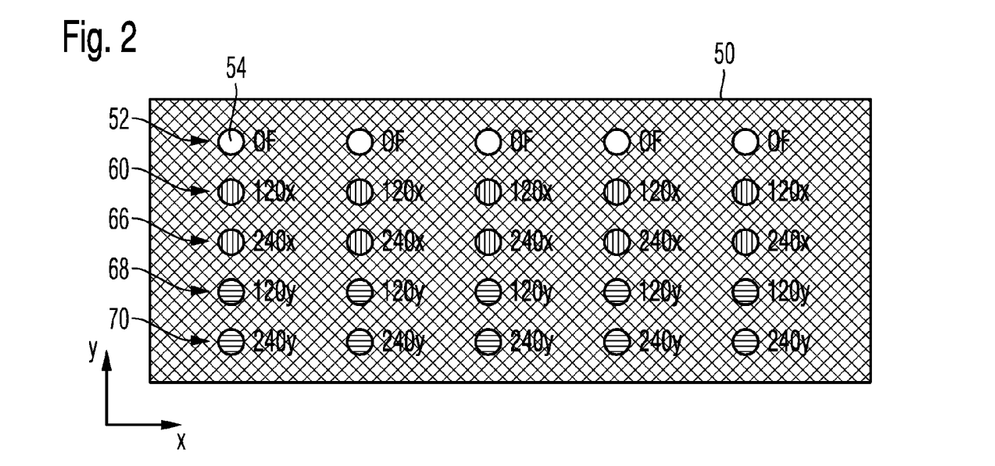
FIG. 2 shows a plan view of a measurement mask for measuring the projection exposure apparatus in the measurement mode.

In a measuring method in accordance with one embodiment according to the invention, a measurement mask 50 is arranged in the mask plane 20, and thus in an exposure beam path 32 of the projection exposure apparatus 10. One embodiment of the measurement mask 50 is shown in FIG. 2. The measurement mask 50 comprises a plurality of rows of different measurement structures running in the x-direction. In this case, the measurement structures in the respective row are identical, such that during an exposure of the measurement mask 66, on account of the effected scanning movement of the measurement mask 50 in the scanning direction 28, a row of identical measurement structures in each case enter into a scanning slot of the illumination system 18. All the measurement structures in the row are thus illuminated simultaneously during an exposure process.

Measurement structures embodied in each case as a pinhole stop 52 are arranged in a first row of the embodiment of the measurement mask 50 as shown in FIG. 2. The pinhole stops 52 each have an aperture 54. The aperture 54 can also be designated as a pinhole. The aperture 54 of a pinhole stop 52 is embodied in each case as a free aperture, that is no light-attenuating structures, in particular no opaque structures, are arranged within the aperture 54. The aperture 54 is typically embodied as a cutout in a chromium layer of the measurement mask 50. In the case of EUV radiation, the aperture 54 can also be a cutout extending through the entire mask. The pinhole stops 52 are identified by "OF" in FIG. 2. This designation is attributed to the English term "open frame", expressing the fact that the pinhole stop 52 constitutes an "open frame" since it is provided with the free aperture 54. In accordance with one embodiment, the aperture 54 is dimensioned in such a way that the pinhole stop 52 has no significant diffraction effect on the exposure radiation 14.

A row having further measurement structures 60 is arranged below the row having pinhole stops 52. The measurement structures 60 each comprise a pinhole stop 62, illustrated in detail e.g. in FIG. 4, and a diffraction grating 64 arranged within an aperture 63 of the pinhole stop 62. The diffraction grating 64 of the measurement structure 60 is embodied as a line grating having diffraction lines offset with respect to one another in the x-direction, wherein the line grating has a period spacing of 120 nm. The measurement structures 60 are therefore identified by "120x" in FIG. 2.

In the row below the measurement structures 60, a row having further measurement structures 66 is situated on the measurement mask 50. The measurement structures 66 differ from the measurement structures 60 merely in the periodicity of the diffraction grating 64. With the value of 240 nm, in the case of the measurement structure 66 said periodicity has a magnitude double that in the case of the measurement structure 60. Furthermore, a row having measurement structures 68 and a row having measurement structures 70 are also arranged on the measurement mask 50. The measurement structures 68 and 70 differ from the measurement structures 60 and 66 merely in that the orientation of the diffraction gratings 64 is rotated by 90°, that is to say that y-gratings having a period spacing of 120 nm and 240 nm, respectively, are involved here. The apertures 54 of the pinhole stops 52 and the respective apertures of the measurement structures 60, 66, 68 have a value of 80 to 100 µm in accordance with an embodiment in which the wavelength of the exposure radiation is 193 nm.

A method for measuring an optical symmetry property of the projection exposure apparatus 10 is described below. In this case, the measured optical symmetry property is what can be designated as a pole balance of the dipole illumination described above. For the purpose of measuring the "pole balance", the measurement mask 50 in accordance with FIG. 2 is arranged in the mask plane 20 of the projection exposure apparatus 10 in accordance with FIG. 1 and FIG. 3. Firstly, the row having the pinhole stops 52 is exposed in this case. For illustrating this process, only one pinhole stop 52 is depicted in the mask plane 20 in FIGS. 1 and 3.

Figure 3:
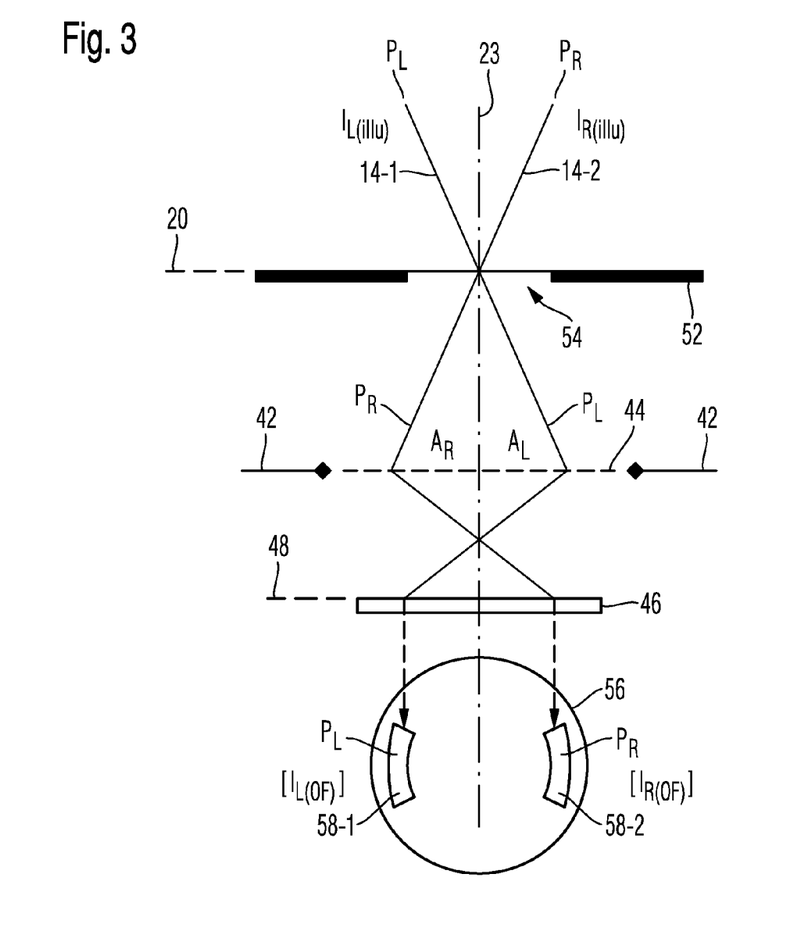
FIG. 3 shows a schematic illustration of the measurement of the pupillogram in accordance with FIG. 1.

In order to carry out the measurement, the wafer stage 26, in which a measurement device 46 in the form of a spatially resolving intensity detector is integrated, is displaced parallel to the optical axis 23 into a measurement plane 48, in which the pupil 44 of the projection lens 22 becomes visible. Said plane can lie above or, as depicted in FIGS. 1 and 3, below the wafer plane 24. In particular, the measurement plane 48 can correspond to a plane that is conjugate with respect to the pupil plane 40.

During measurement operation, the intensity distribution that arises in the measurement plane 48 is then recorded by the measurement device 46. Said intensity distribution is an image of the pupil 44 of the projection lens 22, the so-called pupillogram 56. The intensity distribution defining the pupillogram 22 has two poles 58-1 and 58-2 having high intensity. Said poles correspond to the illumination poles 14-1 and 14-2, which are also designated by $P_L$ and $P_R$, respectively, in FIG. 3.

An evaluation device 49 evaluates the pupillogram 56 and in this case determines an intensity $I_{L(OF)}$ of the left illumination pole $P_L$ and an intensity $I_{R(OF)}$ of the right illumination pole $P_R$, as noted in FIG. 3. In this case, the addition "OF" is attributed to the English term "open frame". As already explained above, this term expresses the fact that the pinhole stop 52 used constitutes an "open frame", i.e. is provided with the free aperture 54. The intensity of an illumination pole is understood to mean an intensity which is intensity-averaged over the cross section or that area of the corresponding illumination pole which is illuminated in the pupillogram.

With the use of the pinhole stop 52 having the free aperture 54, the pole balance $PB_{OF}$ present in the pupillogram 56 is defined as follows:

$$PB_{OF} = \frac{I_{L(OF)}}{I_{R(OF)}}. \quad (1)$$

The pole balance present in the mask plane 20 is designated as $PB_{illu}$. $PB_{illu}$ is thus the pole balance which is present in the exposure radiation 18, also designated as illumination radiation, emitted directly by the illumination system 18 and is defined as follows:

$$PB_{illu} = \frac{I_{L(illu)}}{I_{R(illu)}}, \quad (2)$$

wherein $I_{L(illu)}$ is the intensity of the left illumination pole $P_L$ and $I_{R(illu)}$ is the intensity of the right illumination pole $P_R$ of the exposure radiation 18 radiated into the mask plane 20 at the location of the aperture 54, as noted in FIG. 3.

The transmittance of the projection lens 22 can have an angular dependence, such that the radiation of the left illumination pole $P_L$ upon passing through the projection lens 22 possibly experiences a different attenuation from that of the radiation of the right illumination pole $P_R$. The transmittance of the projection lens 22 for the radiation of the left illumination pole $P_L$ is designated by $A_L$, and the transmittance for the radiation of the right illumination pole $P_R$ is designated by $A_R$. The resultant influence on the pole balance $PB_{OF}$ measured in the pupillogram 56 is designated as the pole balance $PB_{PO}$ of the projection lens 22 and is defined as follows:

$$PB_{PO} = \frac{A_L}{A_R}. \tag{3}$$

The pole balance $PB_{OF}$ in the pupillogram 56 in accordance with FIG. 3 can thus be represented as follows:

$$PB_{OF} = PB_{illu} \cdot PB_{PO}. \tag{4}$$

After measurement of the pupillogram 56 that results from the aperture stop 52 and is illustrated in FIG. 3, the measurement structures 60 of the measurement mask 50, which comprise diffraction gratings 64 having a period spacing of 120 nm, are exposed. This exposure is illustrated for one of the measurement structures 60 in FIG. 4. When the respective exposure radiation 14 of the poles $P_L$ and $P_R$ passes through the diffraction grating 56, diffracted radiation arises besides the radiation $P_L^0$ and $P_R^0$ respectively passing through without being diffracted. The diffracted radiation comprises radiation of the $+1^{st}$ and the $-1^{st}$ orders of diffraction, also designated hereinafter as diffracted poles, namely the poles $P_L^{-1}$ and $P_L^{+1}$ for the radiation of the incident pole $P_L$, and the poles $P_R^{-1}$ and $P_R^{+1}$ for the radiation of the incident pole $P_R$. The pupil boundary 42 in the form of an aperture stop is chosen such that the poles $P_R^{-1}$ and $P_L^{+1}$ are blocked, that is to say that the radiation of said poles is not radiated into the measurement plane 48. Only the respective radiation of the undiffracted poles $P_L^0$, $P_R^0$ and of the poles $P_L^{-1}$ and $P_R^{+1}$ is present within the pupil boundary 42 and therefore advances as far as the measurement plane 48.

Figure 4:
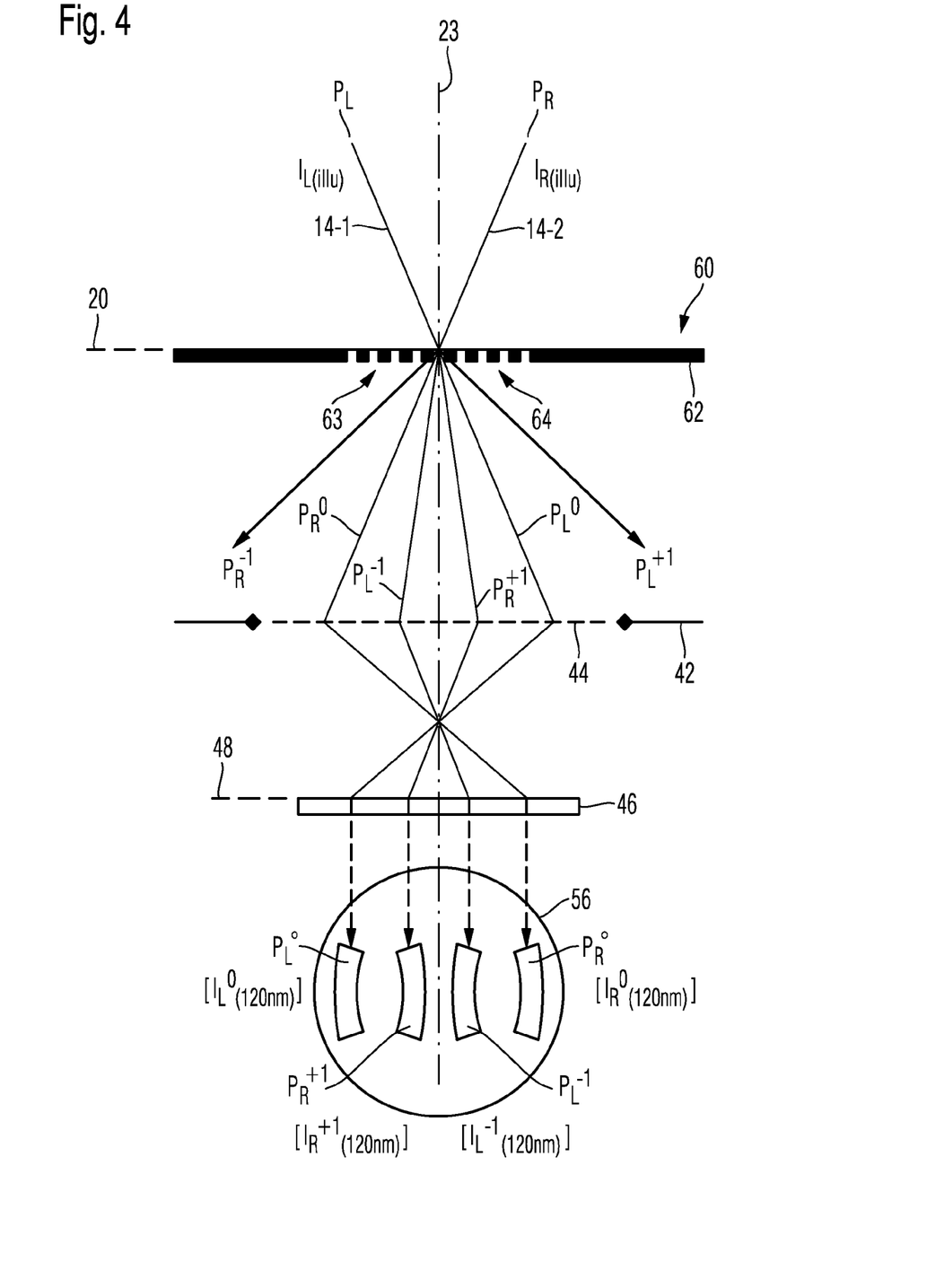
FIG. 4 shows a schematic illustration of a measurement of a pupillogram with the use of a measurement structure comprising a first diffraction grating.

A pupillogram 56 containing the undiffracted poles $P_L^0$, $P_R^0$ and the poles $P_R^{+1}$ and $P_L^{-1}$ of the first order of diffraction of the diffraction grating 64 having the period spacing of 120 nm is thus generated by the measurement structure 60 in the measurement plane 48. The line width of the diffraction grating is 60 nm. The poles mentioned form regions of high intensity that are in each case delimited from one another in the measurement plane 48. The intensities of the poles $P_R^{+1}$ and $P_L^{-1}$, which are designated by $I_R^{+1}{}_{(120\,nm)}$ and $I_L^{-1}{}_{(120\,nm)}$, respectively, are determined in each case in the evaluation device 49.

The ratio of said intensities is designated as the pole balance $PB_{120\,nm}$:

$$PB_{120nm} = \frac{I_{R(120nm)}^{+1}}{I_{L(120nm)}^{-1}}. \tag{5}$$

If $D_{120\,nm}$ is defined as the diffraction efficiency of the diffraction grating 64 having a grating period of 120 nm in the first order of diffraction, then $I_R^{+1}{}_{(120\,nm)}$ and $I_L^{-1}{}_{(120\,nm)}$ can be respectively expressed as follows:

$$I_{R(120\,nm)}^{+1} = I_{R(illu)} \cdot A_L \cdot D_{120\,nm} \text{ and} \tag{6}$$

$$I_{L(120\,nm)}^{-1} = I_{L(illu)} \cdot A_R \cdot D_{120\,nm}. \tag{7}$$

If equations (6) and (7) are inserted into equation (5), this results in:

$$PB_{120nm} = \frac{I_{R(illu)} \cdot A_L}{I_{L(illu)} \cdot A_R}. \tag{8}$$

Figure 5:
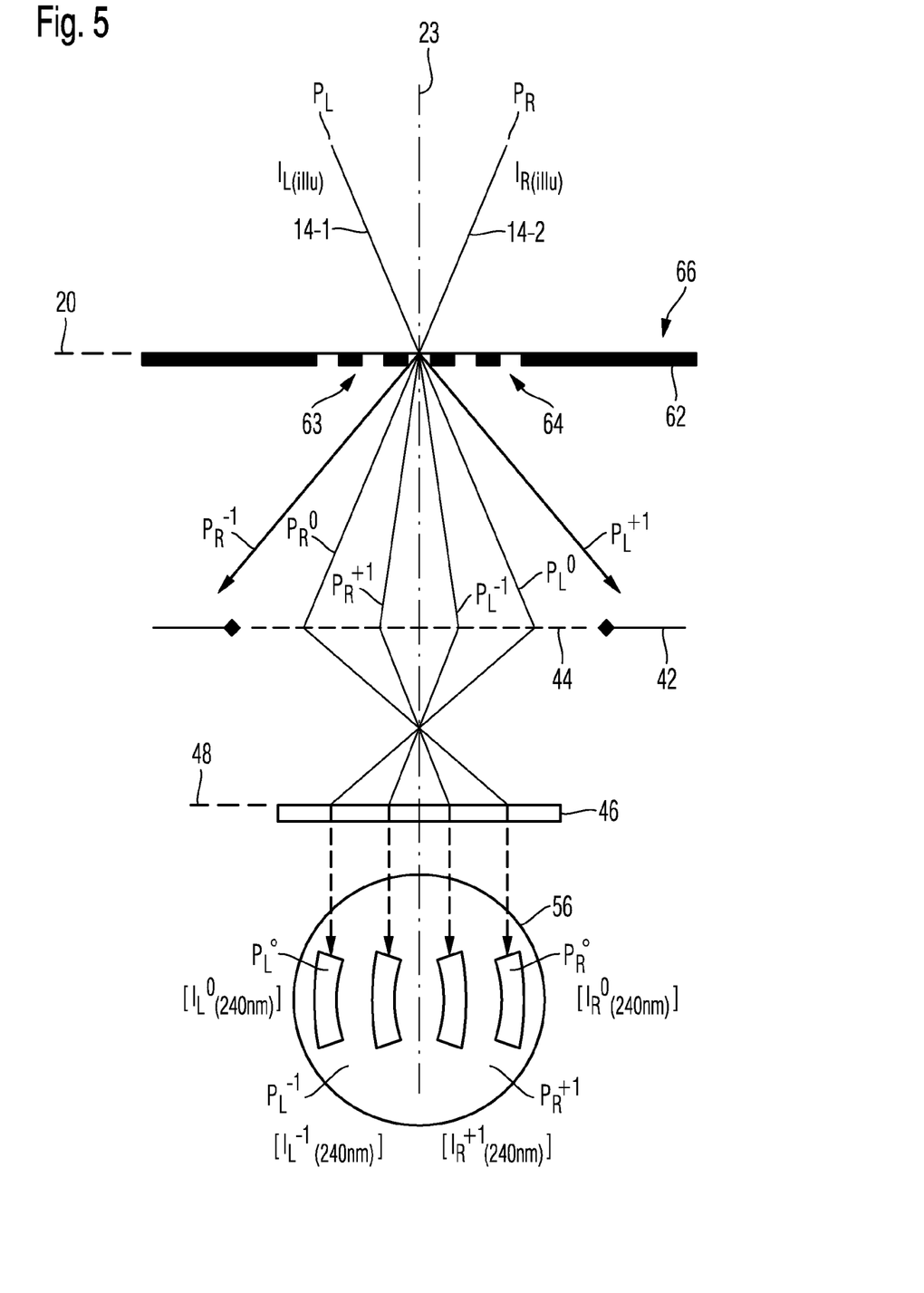
FIG. 5 shows a schematic illustration of a measurement of a pupillogram with the use of a measurement structure comprising a second diffraction grating.

Analogously to the measurement in accordance with FIG. 4, in the case of the measurement with the measurement structure 66 in accordance with FIG. 5, the pupillogram 56 generated in the measurement plane 48 contains the undiffracted poles $P_L^0$ and $P_R^0$. Furthermore, it contains the poles $P_L^{-1}$ and $P_R^{+1}$ of the first order of diffraction of the diffraction grating 64 having the period spacing of 240 nm. In this case, however, in the case of the measurement with a period spacing of 240 nm (see FIG. 5), the poles $P_L^{-1}$ and $P_R^{+1}$ are interchanged compared with the measurement with a period spacing of 120 nm (see FIG. 4). The poles $P_R^{-1}$ and $P_L^{+1}$ lie outside the pupil boundary 42 and are therefore blocked. Furthermore, the line width of the diffraction grating 64 of the measurement structure 66 with a value of 120 nm, for example, is chosen such that the second order of diffraction is largely suppressed.

In the evaluation device 49, the respective intensities of the poles $P_L^{-1}$ and $P_R^{+1}$ are determined from the pupillogram 56 in accordance with FIG. 5. Said intensities are designated by $I_L^{-1}{}_{(240\,nm)}$ and $I_R^{+1}{}_{(240\,nm)}$, respectively. The ratio of said intensities once again is defined as the pole balance $PB_{240\,nm}$:

$$PB_{240nm} = \frac{I_{L(240nm)}^{-1}}{I_{R(240nm)}^{+1}}. \tag{9}$$

If $D_{240\,nm}$ is defined as the diffraction efficiency of the diffraction grating 64 having a grating period of 240 nm in the first order of diffraction, then $I_L^{-1}{}_{(240\,nm)}$ and $I_R^{+1}{}_{(240\,nm)}$ can be respectively expressed as follows:

$$I_{L(240\,nm)}^{-1} = I_{L(illu)} \cdot A_L \cdot D_{240\,nm} \text{ and} \tag{10}$$

$$I_{R(240\,nm)}^{+1} = I_{R(illu)} \cdot A_R \cdot D_{240\,nm}. \tag{11}$$

If the equations (10) and (11) are inserted into equation (9), this results in:

$$PB_{240nm} = \frac{I_{L(illu)} \cdot A_L}{I_{R(illu)} \cdot A_R}. \tag{12}$$

Equations (8), (12) and (2) result in the following:

$$\sqrt{\frac{PB_{240nm}}{PB_{120nm}}} = \frac{I_{L(illu)}}{I_{R(illu)}} = PB_{illu}. \tag{13}$$

$PB_{120\,nm}$ and $PB_{240\,nm}$ are present as measurement results in accordance with (5) and (9). Thus, by inserting these measurement results into equation (13), it is possible for the pole balance $PB_{illu}$ present in the mask plane 20 to be determined experimentally.

Furthermore, equations (4) and (13) result in the following:

$$PB_{PO} = \frac{PB_{OF}}{PB_{illu}} = PB_{OF} \cdot \sqrt{\frac{PB_{120nm}}{PB_{240nm}}}. \quad (14)$$

Since $PB_{OF}$ in accordance with equation (1) is likewise present as a measurement result, the pole balance $PB_{PO}$ characterizing the influence of the transmission behavior of the projection lens 22 can likewise be determined experimentally. The pole balance $PB_{PO}$ determined in this case indicates the quotient of the transmittances $A_L$ and $A_R$ for the beam paths of the poles $P_L$ and $P_R$ of the measurement with the free pinhole stop 52 in accordance with FIG. 3. These poles, the measurement locations of which are designated by 72-1L and 72-1R in FIG. 6, lie in the outer region of the pupil 44 in the pupillogram 56. In other words, the pole balance $PB_{PO}$ determined using equation (14) relates to the transmission behavior of the projection lens 22 in the outer region of the pupil 44 that is defined by the measurement locations 72-1L and 72-1R.

Figure 6:
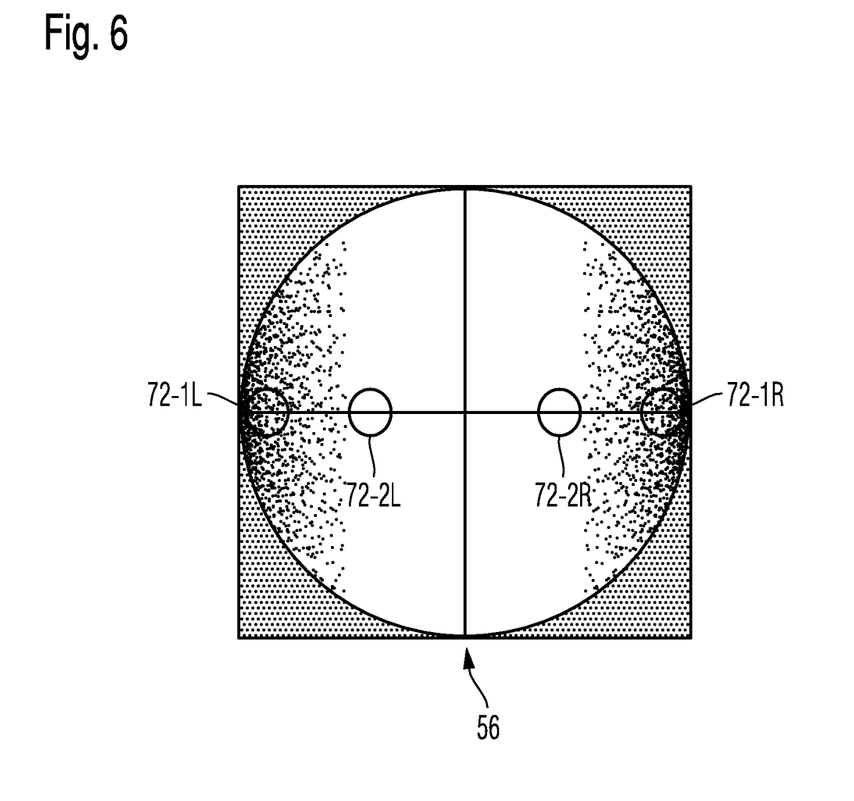
FIG. 6 shows an illustration of different measurement locations within a pupillogram.

Furthermore, the pole balance $PB_{PO}$ can also be determined for a central region of the pupil 44, to be precise for the measurement locations 72-2L and 72-2R, depicted in FIG. 6, at which lie the poles $P_R^{+1}$ and $P_L^{-1}$ recorded in the case of the measurements in accordance with FIG. 4 and FIG. 5 with the use of the diffraction grating 64 having a grating period of 120 nm and the poles $P_L^{-1}$ and $P_R^{+1}$ with the use of the diffraction grating 64 having a grating period of 240 nm. For this case, the pole balance $PB_{PO}$ is determined as follows:

$$PB_{PO} = \sqrt{PB_{240nm} \cdot PB_{120nm}}. \quad (15)$$

Furthermore, the pole balances $PB_{illum}$ and $PB_{PO}$ can also be determined for the dipoles oriented in the y-direction. For this purpose, besides the measurement structures configured as a pinhole stop 52, the measurement structures 68 and 70 of the measurement mask 50 are used, which comprise corresponding diffraction gratings having grating periodicities that are oriented in the y-direction.

Furthermore, it is possible to carry out measurements with dipoles and grating structures which have different orientations, such as +/−45°, for instance, and/or other dipole spacings and grating periods. In this way, the complete transmission profile, i.e. the complete angular dependence of the transmittance, of the projection lens 22 can be determined using fitting algorithms. Furthermore, it is also possible to determine the behavior of the illumination system 18 for all conceivable irradiation angles.

Furthermore, it is possible to use, instead of a standard dipole having poles 58-1 and 58-2 embodied as ring segments, said standard dipole being illustrated e.g. in FIG. 3, dipoles whose poles have a symmetrical shape, such as e.g. leaf-shaped dipoles. In this case it is possible for the orders of diffraction $P_R^{+1}$ and $P_L^{-1}$ in the case of a grating period of 120 nm together with the orders of diffraction $P_L^{-1}$ and $P_R^{+1}$ in the case of a grating period of 240 nm to be superimposed exactly with one another. The accuracy of the measurement results can thus be increased.

LIST OF REFERENCE SIGNS 10 projection exposure apparatus
12 exposure radiation source
14 exposure radiation
14-1 left illumination pole
14-2 right illumination pole
18 illumination system
20 mask plane
22 projection lens
23 optical axis
24 wafer plane
26 wafer stage
28 scanning direction of mask stage
30 scanning direction of wafer stage
32 exposure beam path
36 aperture stop of the illumination system
38-1 stop cutout
38-2 stop cutout
40 pupil plane
42 pupil boundary
44 pupil
46 measurement device
48 measurement plane
49 evaluation device
50 measurement mask
52 pinhole stop
54 aperture
56 pupillogram
58-1 left pole
58-2 right pole
60 measurement structure
62 pinhole stop
63 aperture
64 diffraction grating
66 measurement structure
68 measurement structure
70 measurement structure
72-1 measurement locations in outer region
72-2 measurement locations in central region

What is claimed is:

1. A microlithographic projection exposure apparatus comprising:
    an illumination system configured to illuminate a mask plane with an exposure radiation,
    a projection lens arranged downstream of the mask plane, wherein the projection lens defines a pupil for the apparatus,
    a pinhole stop arranged in an exposure beam path of the projection exposure apparatus;
    a measurement device configured to record intensity distributions in a measurement plane arranged downstream of the projection lens and offset from a wafer plane such that the intensity distribution is indicative of an intensity distribution at the pupil, and
    an evaluation device configured to determine, from a plurality of the intensity distributions recorded in the measurement plane, an influence of the projection lens on a symmetry property of an intensity distribution of the pupil that is measured in the measurement plane, wherein an influence of the illumination system on the determination of the influence of the projection lens on the symmetry property is reduced based upon the plurality of intensity distributions recorded in the measurement plane.

2. The projection exposure apparatus according to claim 1,
    wherein the evaluation device is configured to determine the influence of the projection lens on the symmetry property from intensity distributions which are generated through at least two different measurement structures arranged in the mask plane,
    wherein each of the measurement structures comprises a pinhole stop and a diffraction grating arranged within a respective aperture of each of the pinhole stops, and wherein the diffraction gratings of the two measurement structures have differing grating periods.

3. The projection exposure apparatus according to claim 1, wherein the evaluation device is configured to determine the influence of the projection lens on an intensity ratio of two illumination poles of the projection exposure apparatus, the intensity ratio being measured in the measurement plane.

4. The projection exposure apparatus according to claim 1, wherein:
the illumination system is configured to generate a first illumination pole and a second illumination pole incident on the mask plane; and
the evaluation device is configured to reduce the influence on the symmetry property by comparing an intensity of a first pupillogram pole in the measurement plane generated by the first illumination pole with an intensity of a second pupillogram pole in the measurement plane generated by the second illumination pole.

5. The projection exposure apparatus according to claim 1, wherein the evaluation device is configured to compare pupillogram poles in at least two of the plurality of the intensity distributions recorded in the measurement plane, wherein the pupillogram poles are generated by radiation having passed through the projection lens along essentially the same path.

6. The projection exposure apparatus according to claim 5, wherein a first of the pupillogram poles is generated by a first measurement structure and a second of the pupillogram poles is generated by a second measurement structure.

7. The projection exposure apparatus according to claim 1, wherein the pinhole stop comprises a measurement mask having a first aperture and a second aperture;
wherein a first of the plurality of the intensity distributions recorded in the measurement plane is made through the first aperture of the measurement mask; and
wherein a second of the plurality of the intensity distributions recorded in the measurement plane is made through the second aperture of the measurement mask.

8. The projection exposure apparatus according to claim 7, wherein the first aperture comprises a first measurement structure, and the second aperture comprises a second measurement structure.

9. The projection exposure apparatus according to claim 8, wherein the first measurement structure comprises a first grating having a first grating period, and the second measurement structure comprises a second grating having a second grating period, wherein the first grating period and the second grating period are different.

10. The projection exposure apparatus according to claim 9, wherein the first of the plurality of the intensity distributions recorded in the measurement plane comprises a first of pupillogram pole generated by the first measurement structure and wherein the second of the plurality of the intensity distributions recorded in the measurement plane comprises a second pupillogram pole generated by a second measurement structure.

11. A microlithographic projection exposure apparatus comprising:
an illumination system configured to illuminate a mask plane with an exposure radiation,
a projection lens arranged downstream of the mask plane, wherein the projection lens defines a pupil for the apparatus,
a pinhole stop arranged in an exposure beam path of the projection exposure apparatus;
a measurement device configured to record intensity distributions in a measurement plane arranged downstream of the projection lens and offset from a wafer plane such that the intensity distribution is indicative of an intensity distribution at the pupil, and
an evaluation device configured to determine, from a plurality of the intensity distributions recorded in the measurement plane, an influence of the illumination system on a symmetry property of an intensity distribution of the pupil that is measured in the measurement plane, wherein an influence of the projection lens on the determination of the influence of the illumination system on the symmetry property is reduced based upon the plurality of intensity distributions recorded in the measurement plane.

12. The projection exposure apparatus according to claim 11,
wherein the evaluation device is configured to determine the influence of the illumination system on the symmetry property from intensity distributions which are generated through at least two different measurement structures arranged in the mask plane,
wherein each of the measurement structures comprises a pinhole stop and a diffraction grating arranged within a respective aperture of each of the pinhole stops, and
wherein the diffraction gratings of the two measurement structures have differing grating periods.

13. The projection exposure apparatus according to claim 11, wherein the evaluation device is configured to determine the influence of the illumination system on an intensity ratio of two illumination poles of the projection exposure apparatus, the intensity ratio being measured in the measurement plane.

14. The projection exposure apparatus according to claim 11, wherein:
the illumination system is configured to generate a first illumination pole and a second illumination pole incident on the mask plane; and
the evaluation device is configured to reduce the influence on the symmetry property by comparing an intensity of a first pupillogram pole in the measurement plane generated by the first illumination pole with an intensity of a second pupillogram pole in the measurement plane generated by the second illumination pole.

15. The projection exposure apparatus according to claim 11, wherein the evaluation device is configured to compare pupillogram poles in at least two of the plurality of the intensity distributions recorded in the measurement plane, wherein the pupillogram poles are generated by radiation having passed through the projection lens along essentially the same path.

16. The projection exposure apparatus according to claim 15, wherein a first of the pupillogram poles is generated by a first measurement structure and a second of the pupillogram poles is generated by a second measurement structure.

17. The projection exposure apparatus according to claim 11, wherein the pinhole stop comprises a measurement mask having a first aperture and a second aperture;
wherein a first of the plurality of the intensity distributions recorded in the measurement plane is made through the first aperture of the measurement mask; and
wherein a second of the plurality of the intensity distributions recorded in the measurement plane is made through the second aperture of the measurement mask.

18. The projection exposure apparatus according to claim 17, wherein the first aperture comprises a first measurement structure, and the second aperture comprises a second measurement structure.

19. The projection exposure apparatus according to claim 18, wherein the first measurement structure comprises a first grating having a first grating period, and the second measurement structure comprises a second grating having a second grating period, wherein the first grating period and the second grating period are different.

20. The projection exposure apparatus according to claim 9, wherein the first of the plurality of the intensity distributions recorded in the measurement plane comprises a first of pupillogram pole generated by the first measurement structure and wherein the second of the plurality of the intensity distributions recorded in the measurement plane comprises a second pupillogram pole generated by a second measurement structure.

* * * * *

UNITED STATES PATENT AND TRADEMARK OFFICE
CERTIFICATE OF CORRECTION

PATENT NO. : 9,703,205 B2
APPLICATION NO. : 14/853443
DATED : July 11, 2017
INVENTOR(S) : Neumann et al.

Page 1 of 1

It is certified that error appears in the above-identified patent and that said Letters Patent is hereby corrected as shown below:

In the Specification

Column 1, Line 53, Delete "fir" and insert -- for --, therefor.

Signed and Sealed this
Tenth Day of September, 2019

Andrei Iancu
*Director of the United States Patent and Trademark Office*